United States Patent [19]
Yeo et al.

[11] Patent Number: 5,835,172
[45] Date of Patent: Nov. 10, 1998

[54] THIN FILM TRANSISTOR LIQUID CRYSTAL DISPLAY WITH MAIN GATE ELECTRODE CONTACTING SUBSIDIARY GATE ELECTRODES AND METHOD OF FABRICATING

[75] Inventors: Ju-Cheon Yeo, Kyungki-do; Sang-Gul Lee, Seoul, both of Rep. of Korea

[73] Assignee: LG Electronics, Inc., Seoul, Rep. of Korea

[21] Appl. No.: 874,659

[22] Filed: Jun. 13, 1997

[30] Foreign Application Priority Data

Aug. 24, 1996 [KR] Rep. of Korea ............... 96-35334

[51] Int. Cl.[6] ............... G02F 1/136; H01L 29/76
[52] U.S. Cl. ............... 349/46; 349/42; 349/43; 257/366; 257/408
[58] Field of Search ............... 349/42, 43, 46, 349/47; 257/366, 408

[56] References Cited

U.S. PATENT DOCUMENTS

| | | | |
|---|---|---|---|
| 4,907,197 | 3/1990 | Uchida | 365/185 |
| 5,047,816 | 9/1991 | Cuevas | 257/366 |
| 5,124,769 | 6/1992 | Tanaka et al. | 257/366 |
| 5,208,476 | 5/1993 | Inoue | 257/408 |
| 5,672,515 | 9/1997 | Hayashi et al. | 437/2 |

FOREIGN PATENT DOCUMENTS

| | | |
|---|---|---|
| 0513590 A2 | 11/1992 | European Pat. Off. . |
| 0589478 A2 | 3/1994 | European Pat. Off. . |
| 5-521702 | 9/1993 | Japan . |
| 5-315605 | 11/1993 | Japan . |
| 6-13407 | 1/1994 | Japan . |

*Primary Examiner*—Antia Pellman Gross
*Assistant Examiner*—Tarifur R. Chowdhury
*Attorney, Agent, or Firm*—Morgan, Lewis & Bockius LLP

[57] ABSTRACT

A thin-film transistor liquid crystal display includes a substrate, an active layer on the substrate, having first and second impurity regions and first, second, and third non-impurity regions, gate insulating layer on the active layer, first and second electric field control layers on the second and third non-impurity regions, respectively, first and second subsidiary gate electrodes on the first and second electric field control layers, respectively, and a main gate electrode on the gate insulating layer, the main gate electrode contacting the first and second subsidiary gate electrodes and the first and second electric field control layers, respectively.

45 Claims, 13 Drawing Sheets

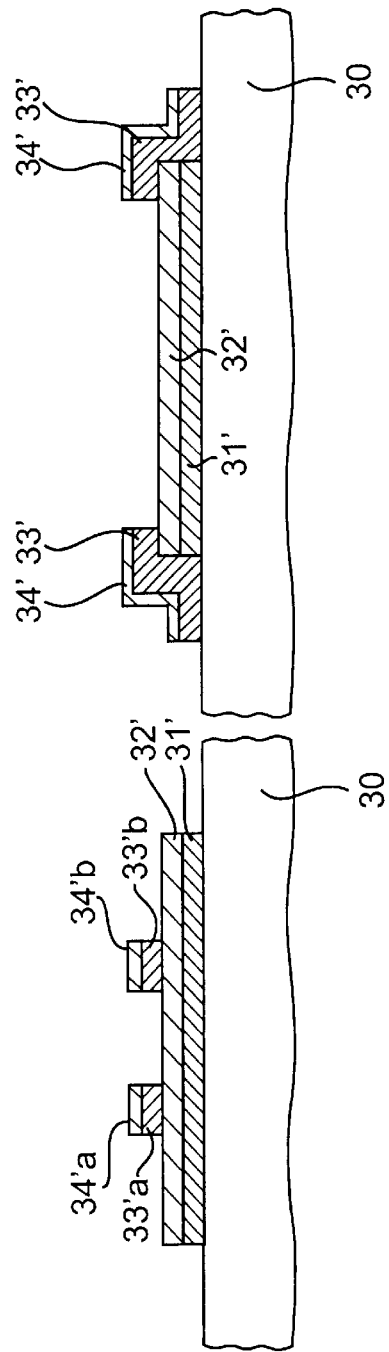
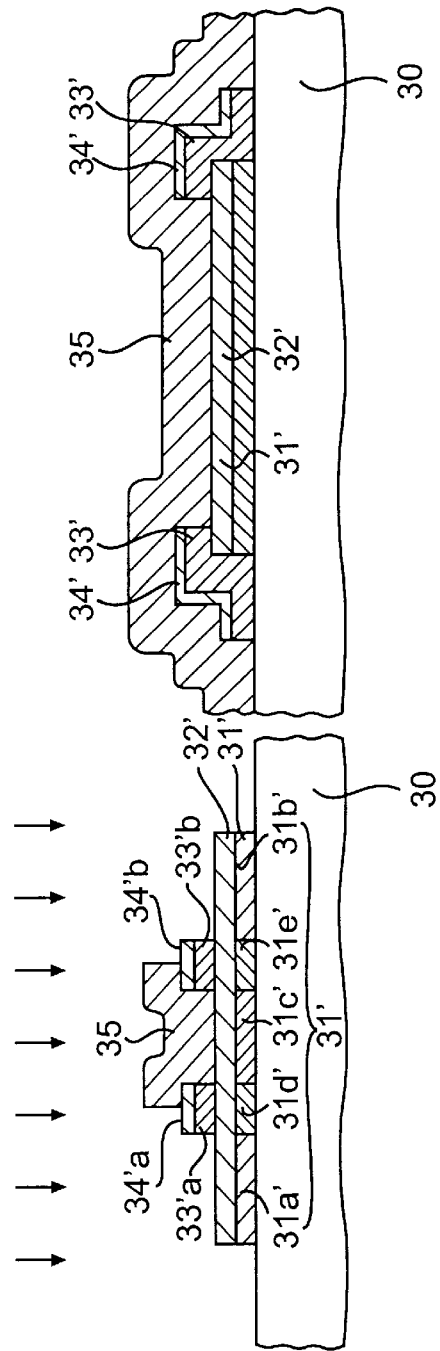
FIG. 5D
FIG. 5E

THIN FILM TRANSISTOR LIQUID CRYSTAL DISPLAY WITH MAIN GATE ELECTRODE CONTACTING SUBSIDIARY GATE ELECTRODES AND METHOD OF FABRICATING

This application claims the benefit of Korean Application No. 96-35334, filed Aug. 24, 1996, which is hereby incorporated by reference.

BACKGROUND OF THE INVENTION

1. Field of the Invention

The present invention relates to a thin-film transistor liquid crystal display, and more particularly, to a thin-film transistor liquid crystal display and a method of fabricating the same. Although the present invention is suitable for a wide scope of applications, it is particularly suitable for reducing a leakage current at off-state as well as having a desirable current characteristic at on-state.

2. Discussion of the Related Art

In a conventional liquid crystal display, a signal generated from a thin film transistor must be maintained for a period of time after the signal is transferred to a pixel by a switching device. Leakage current generated within the liquid crystal display creates a serious problem because it deteriorates the screen display characteristic.

Amorphous silicon has been a widely used semiconducting material for a conventional thin film transistor liquid crystal display. Although the thin film transistor liquid crystal display fabricated with amorphous silicon does have some disadvantages in its current characteristic at on-state due to low charge mobility, leakage current is not a serious problem.

Amorphous silicon thin film transistor can also be used for a switching device for a pixel portion. Nonetheless, amorphous silicon is not a suitable material for forming a circuit portion, especially when a conventional driving circuit is formed directly on a substrate because of low charge mobility.

Polycrystal silicon has a better charge mobility than amorphous silicon and has been the subject of intensive research. Particularly, when a driving circuit is formed on the substrate at the location of a pixel, the polycrystal silicon thin film transistor has a higher charge mobility.

On the other hand, while a polycrystal silicon thin film transistor drives a high current at on-state, a significant amount of leakage current occurs during the off-state. As a result, when the switching device for the pixel is fabricated using a polycrystal silicon thin film transistor, the screen display performance of the liquid crystal display can be degraded by unstable signals stored at the pixel electrode due to a high leakage current during the off-state.

To avoid such a problem, a thin film transistor or double gate type thin film transistor having structures using a lightly doped drain (LDD) region, an offset region, or a field plate has been suggested when polycrystal silicon is used for fabricating the switching device for the pixel.

FIG. 1 illustrates a conventional self-alignment offset thin film transistor. The structure of thin film transistor was intended to solve the problem of unstable current during the onstate caused by variation in an offset region height.

As shown in FIG. 1, the conventional thin film transistor includes an active layer 11 and a gate insulating film 12 on a substrate 10. Ion implanting preventive layers 13a, 13b are formed by an insulating material on the gate insulating film 12 to define offset regions 11d, 11e at both ends of a channel region 11c at the active layer 11. A gate electrode 14 is provided between the ion implanting preventive layers 13a, 13b. The offset regions 11 d, 11e have a constant length at the active layer 11.

However, since the thin film transistor as described above is subject to limitations in the resolution of photolithography, it is not easy to obtain the offset regions 11 d, 11e having a length less than 2–3 μm, which is defined by the ion implanting preventive layers 13a, 13b.

SUMMARY OF THE INVENTION

Accordingly, the present invention is directed to a thin-film transistor liquid crystal display and a method of fabricating the same which substantially obviate one or more of the problems due to limitations and disadvantages of the related art.

An object of the present invention is a thin-film transistor liquid crystal display having a structure to reduce the leakage current during the off-state without reducing current during the on-state.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a thin-film transistor liquid crystal display comprising a substrate, an active layer having more than at least one of a high concentration impurity regions more than at least two, non-impurity region consisted of a first region defined on a part region between said high concentration impurity regions and a second region contacted and formed on one side and both sides of said first region, and patterned in the shape of island-like on said substrate, an insulating layer formed to cover said active layer, an interlayer formed to be deposited on the top of said insulating layer on said second region, a first conductive layer formed to deposit at least one conductive material in the same pattern on the top of said interlayer, and a second conductive layer formed to be contact-connected with said first conductive layer, and covering the top of said insulating layer on said first region.

In another aspect, the present invention provides a method of manufacturing the thin-film transistor includes an active layer having more than at least one of a high concentration impurity regions more than at least two, non-impurity region consisted of a first region defined on a part region between said high concentration impurity regions and a second region contacted and formed on one side and both sides of said first region, said method comprising steps of forming the active layer by patterning after depositing a semiconductor material on the substrate, forming an insulating layer and interlayer and first conductive layer to cover the top of said active layer, patterning said first conductive layer and interlayer to leave said first conductive layer and interlayer on the top of said second region of said active layer, forming a second conductive layer to be contacted with said first conductive layer, covering said insulating layer of the top of said first region of said active layer, and forming said high concentration impurity region on said active layer by injecting ion on the active layer using said second conductive layer and first conductive layer as a mask.

In another aspect of the present invention, a thin film transistor liquid crystal display includes a thin film transistor liquid crystal display comprising a substrate, an active layer on the substrate having first and second impurity regions and first, second, and third non-impurity regions, a gate insulating layer on the active layer, first and second electric field control layers on the second and third non-impurity regions, respectively, first and second subsidiary gate electrodes on the first and second electric field control layers, respectively, and a main gate electrode on the gate insulating layer, the main gate electrode contacting the first and second subsidiary gate electrodes and the first and second electric field control layers, respectively.

In another aspect of the present invention, a thin-film transistor liquid crystal display includes a substrate, an active layer having first and second impurity regions, first and second leakage current control regions and a channel region, a gate insulating layer on the active layer, and an exposed surface of the substrate, first and second electric field control layers on the first and second leakage current control regions, respectively, first and second subsidiary gate electrodes on the first and second electric field control layers, respectively, a main gate electrode on the gate insulating layer, the main gate electrode contacting the first and second subsidiary gate electrodes and the first and second electric field control layers, respectively.

In another aspect of the present invention, a thin-film transistor liquid crystal display includes a substrate, an active layer having first and second impurity regions, first and second leakage current control regions and a channel region, a gate insulating layer on the active layer, the gate insulating has a pattern the same as the active layer, first and second electric field control layers on the first and second leakage current control regions, respectively, first and second subsidiary gate electrodes on the first and second electric field control layers, respectively, and a main gate electrode on the gate insulating layer, the main gate electrode contacting the first and second subsidiary gate electrodes and the first and second electric field control layers, respectively.

In another aspect of the present invention, a thin film transistor liquid crystal display includes a substrate, an active layer having first and second impurity regions, first and second leakage current control regions and a channel region, a gate insulating layer on the active layer, and an exposing surface over the substrate, first and second electric field control layers on the first and second leakage current control regions, respectively, first and second subsidiary gate electrodes on the first and second electric field control layers, respectively, and source and drain electrodes contacting the first and second impurity regions, respectively, a portion of the source and draw in electrodes being below the first and second impurity regions.

In another aspect of the present invention, a thin film transistor liquid crystal display comprising a substrate, an active layer having first second, and third impurity regions, first and second leakage current control regions and first and second channel regions on the substrate, the leakage current control regions being between one of the impurity regions and one of the channel regions, a gate insulating layer on the active layer including an exposed surface of the substrate, first and second electric field control layers on the first and second leakage current control regions, respectively, first and second subsidiary gate electrodes on the first and second electric field control layers, respectively, first and second main gate electrodes on the gate insulating layer, the first main gate electrode contacting the first electric field control layer and the first subsidiary main gate electrode, the second main gate electrode contacting the first electric field control layer and the first subsidiary main gate electrode, the second main gate electrode contacting the second electric field control layer and the second subsidiary main gate electrode, respectively, and source and drawn in electrodes contacting the impurity regions.

In another aspect of the present invention, a method of fabricating a thin film transistor liquid crystal display, the method includes the steps of forming an active layer on a substrate, forming a gate insulating layer on the active layer including an exposed surface of the substrate, forming first and second electric field control layers on the gate insulating layer, forming first and second subsidiary gate electrodes on the first and second electric field control layers, respectively, forming a main gate electrode on the gate insulating layer including portions of the electric filed control layers and the subsidiary gate electrodes, and implanting impurity ions using the main gate electrode and the subsidiary gate electrodes as masks to form first and second impurity regions and first, second, and third non-impurity regions at the active layer.

In another aspect of the present invention, a method of fabricating a thin film transistor liquid crystal display, the method includes the steps of forming an active layer on a substrate forming a gate insulating layer on the active layer, patterning the active layer and the gate insulating layer simultaneously, forming first and second electric field control layers on the gate insulating layer, the first and second electric field control layers covering edges of the active layer and the gate insulating layer, forming first and second subsidiary gate electrodes on the first and second electric control layers, respectively, forming a main gate electrode on the gate insulating layer including portions of the electric field control layers and the subsidiary gate electrodes, and implanting impurity ions using the main gate electrode and the subsidiary gate electrodes as masks to form first and second impurity regions and first, second, and third non-impurity regions at the active layer.

In another aspect of the present invention, a method of fabricating a thin film transistor liquid crystal display, the method includes the steps of forming source and drain electrodes on a substrate forming an active layer on the substrate including a portions of the source and drain electrodes, forming a gate insulating layer on an overall surface of the substrate, forming first and second electric field control layers, forming first and second subsidiary gate electrodes on the first and second electric field control layers, respectively, forming a main gate electrode on the gate insulating layer including portions of the subsidiary gate electrodes and the electric field control layers, and implanting impurity ions using the main gate electrodes and the subsidiary gate electrode as masks to form a first and second impurity regions and first, second, and third non-impurity regions at the active layer.

In a further aspect, a method of fabricating a thin film transistor liquid crystal display, the method comprising the steps of forming an active layer on a substrate, forming a gate insulating layer on the active layer including an exposed surface of the substrate, forming an amorphous silicon layer on the gate insulating on the gate insulating layer, implanting impurity ions against the amorphous silicon layer to have an impurity concentration at the surface of the silicon layer higher than that of the rest of the silicon layer, patterning the amorphous silicon layer to form first and second electric field control layer and first and second subsidiary gate electrodes, forming a main gate electrode on the gate insulating layer including portions of the subsidiary gate electrodes and the electric field control layers, and implanting impurity ions using the main gate electrodes and subsidiary gate electrodes as masks to form first and second impurity regions and first, second, and third non-impurity regions at the active layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIGS. 5A, 5B, 5C, 5D and 5E are cross-sectional views showing the process steps of fabricating a thin film transistor of the second embodiment of the present invention.

DETAILED DESCRIPTION OF THE PREFERRED EMBODIMENTS

Reference will now be made in detail to the preferred embodiments of the present invention, examples of which are illustrated in the accompanying drawings.

Figure 2:
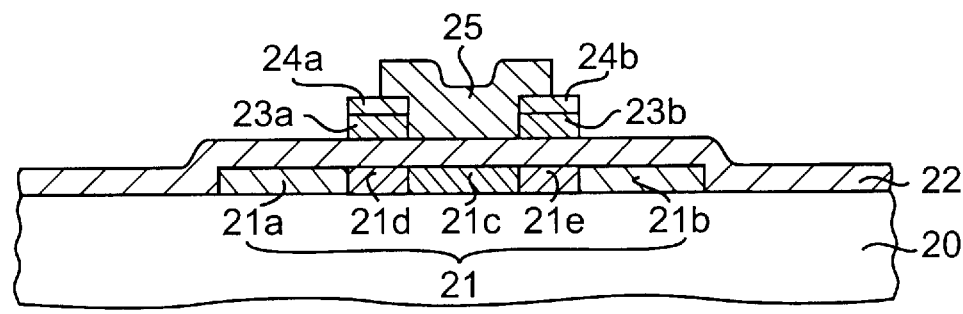
FIG. 2 is a cross-sectional view showing a structure of a first embodiment of the present invention.

FIG. 2 is a first embodiment of the present invention (showing only a thin film transistor) having a typical top gate coplanar thin film transistor for a switching device at the pixel portion.

As shown in FIG. 2, the thin film transistor includes an active layer 21 formed of polycrystal silicon or amorphous silicon on a substrate 20, a gate insulating film 22 over the substrate 20 including the active layer 21, electric field control layers 23a, 23b patterned by an insulating film having a multi-layer or single-layer structure on the gate insulating film 22, subsidiary gate electrodes 24a, 24b patterned by a conductive material on the electric field control layers 23a, 23b, and a main gate electrode 25 contacting the subsidiary gate electrodes 24a, 24b, and a non-impurity region 21c between the subsidiary gate electrodes 24a, 24b.

The active layer 21 is formed to have a predetermined length and to have impurity regions 21a, 21b at opposite ends of the active layer 21. The impurity regions 21a, 21b contact source and drain electrodes (not shown in FIG. 2). For the purpose of explaining the device operation, the non-impurity region 21c between the impurity regions 21a, 21b is divided into another non-impurity regions 21d, 21e below the electric field control layers 23a, 23b. In this structure, the non-impurity region 21c is overlapped with the main gate electrode 25, and the gate insulating film 22 is formed between the non-impurity region 21c and the main gate electrode 25.

Further, the electric field control layers 23a, 23b and the gate insulating film 22 are formed between the gate electrodes (including the subsidiary gate electrodes 24a, 24b and the main gate electrode 25) and the non-impurity regions 21d, 21e (hereinafter, "leakage current control region"). When an on-voltage or an off-voltage is applied to the gate electrode, a weak electric field is applied to the leakage current control region. However, such structured thin film transistor provides a better on-current characteristic than a thin film transistor having an offset region between the channel region (see below) and the impurity region. This result is mainly from a structure which the main gate electrode 25 and the gate insulating film 22 are formed over the non-impurity region 21c (hereinafter, referred to "channel region") without the leakage current control region.

In addition, when the off-voltage is applied to the transistor having the leakage current control region, the leakage current at the off-state is reduced because the electric field generated by the gate voltage to be applied to the leakage current control region becomes small.

FIGS. 3A to 3E are cross-sectional views showing the processing steps of fabricating the thin-film transistor shown in FIG. 2 of a first embodiment of the present invention.

Figure 3A:
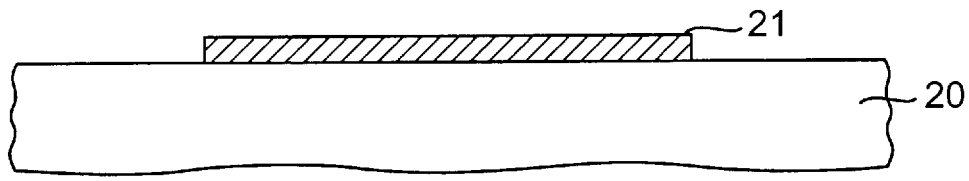
FIGS. 3A, 3B, 3C, 3D, and 3E are cross-sectional views showing the process steps of fabricating a thin film transistor of the first embodiment of the present invention.

Referring to FIG. 3A, an active layer 21 is formed on a substrate 20 by depositing amorphous or polycrystal silicon (for example, using chemical vapor deposition) and is patterned by photolithography. If amorphous silicon is selected for the first step, it can be transformed to polycrystal silicon by laser-annealing or by a solid phase crystallization (SPC) method. This process can be executed either before or after patterning the amorphous silicon.

Figure 3B:
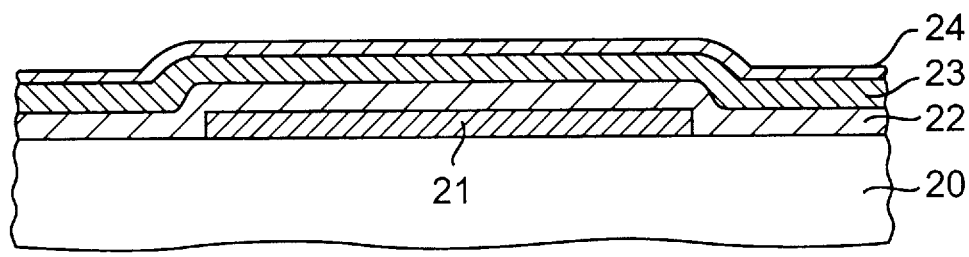
Figure 3C:
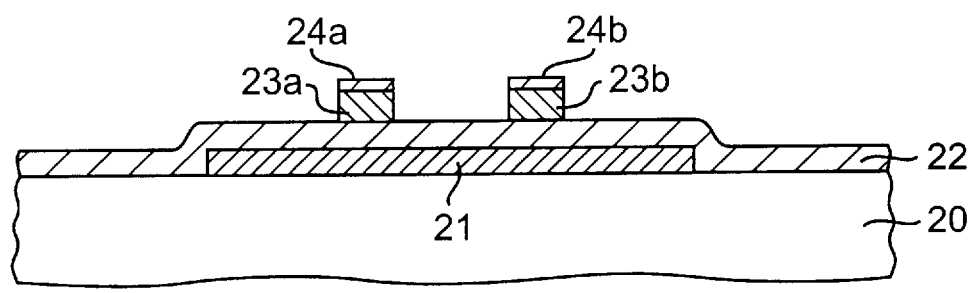

Referring to FIG. 3B, a gate insulating film 22 is formed on the substrate including the active layer 21. A silicon oxide film or a silicon nitride film is used for the gate insulating film 22. Alternatively, a double structured insulating film, such as a silicon oxide/silicon nitride film or a silicon nitride/silicon oxide film, may be formed on the active region 21. Further, a triple structured insulating film, such as a silicon oxide/silicon nitride/silicon oxide film, may be formed on the substrate including the active region 21.

An electric field control layer 23 is formed on the gate insulating film 22 using a CVD method, for example. A subsidiary gate electrode layer 24 of, for example, chromium or aluminum is formed on the electric field control layer 23 by sputtering. The electric field control layer 23 is formed from amorphous, polycrystalline or microcrystalline silicon.

The subsidiary gate electrodes 24a, 24b and the electric field control layers 23a, 23b are formed by patterning the subsidiary gate electrode layer 24 and the electric field control layer using photolithography.

Figure 3D:
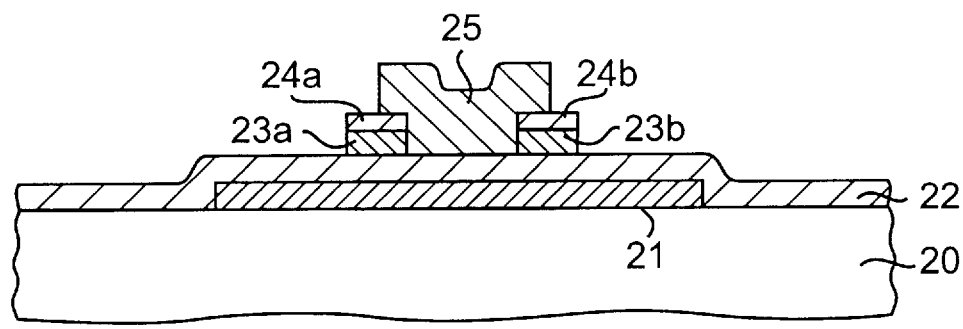

Referring to FIG. 3D, a main gate electrode 25 is formed by depositing a conductive layer, such as chromium, aluminum, or metal alloys, by sputtering and then patterning by photolithography. The main gate electrode 25 is formed to contact the subsidiary gate electrodes 24a, 24b.

Figure 3E:
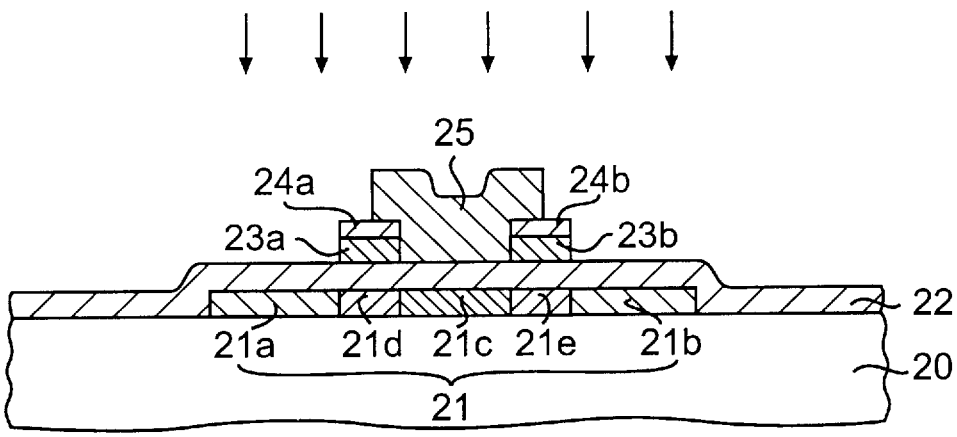

Referring to FIG. 3E, impurity regions 21a, 21b are defined on the active layer 21 by injecting high concentration ions. For example, $B^+$ or $P^+$ ions are implanted into the active layer 21 through the gate insulating film 22 using the main gate electrodes 25 and the subsidiary gate electrodes 24a, 24b as masks. In this process, non-impurity regions 21c, 21d, 21e are also defined between the impurity regions 21a, 21b. For the purpose of explaining the device operation, the active layer 21 is further defined as the non-impurity regions 21c, 21d, 21e, a channel region 21c, the impurity regions 21a, 21b, and leakage current control regions 21d and 21e as shown in FIG. 3E.

Figure 4A:
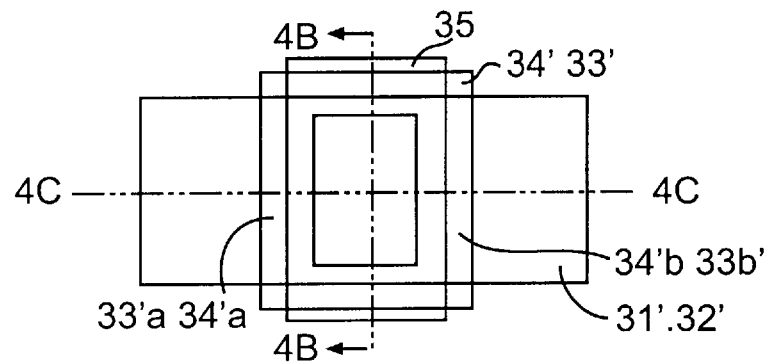
FIG. 4A is a plan view of a second embodiment of the present invention.
Figure 4B:
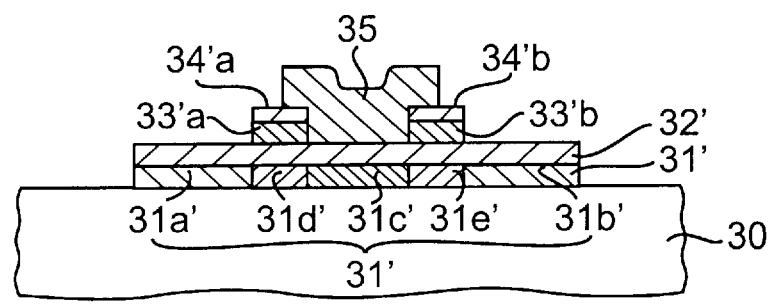
FIGS. 4B and 4C are cross-sectional views of the embodiment of FIG. 4A taken along the lines 4B and 4C—4C, respectively.
Figure 4C:
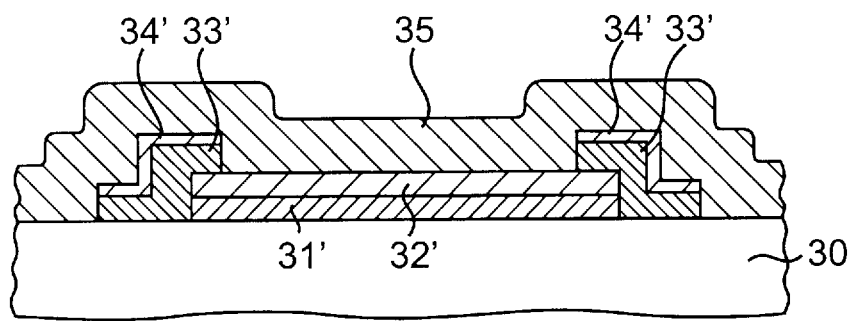

FIGS. 4A to 4C illustrate a second embodiment of the present invention having an active layer 31' and a gate insulating film 32' formed by the same patterning process unlike the first embodiment shown in FIG. 2. In addition, subsidiary gate electrodes 34a', 34b' and electric field control layers 33a', 33b' are formed to cover edges of the active layer 31' and the gate insulating film 32'.

Referring to FIG. 4A, a plan view of the second embodiment of the present invention. As shown in FIG. 4A, the active layer 31' and the gate insulating film 32' are formed on a substrate (not shown). A channel region (not shown) is exposed to the gate electrode, and an insulating layer 33' and an conductive layer 34' are formed to cover edges of a leakage current control region (not shown), the active layer 31', and the gate insulating film 32'. A main gate electrode 35 is overlapped with the channel region (not shown) and partly overlapped with the conductive layer 34'a, 34'b and the electric field control layer 33'a, 33'b at an upper portion of the leakage control region (not shown), and covers the conductive layer 34'.

FIG. 4B is a cross-sectional view taken along a line 4B—4B indicated in FIG. 4A explaining a structure of the thin film transistor. The thin film transistor includes impurity regions 31'a, 31'b on a substrate 30 and an active layer 31' defined by leakage current control regions 31'd, 31'e (non-impurity regions) and channel region 31'c. A gate insulating film 32' covers electric field control layers 33'a, 33'b and overlaps the leakage current control regions 31'd, 33'e. Subsidiary gate electrodes 34'a, 34'b, and the main gate electrode 35 overlap the channel region 31'c and are connected to the subsidiary gate electrodes 34'a, 34'b.

FIG. 4C is a cross-sectional view taken along a line 4C—4C shown in FIG. 4A to explain the structure of the edges of the active layer. As shown in FIG. 4C, an active layer 31' and a gate insulating film 32' are formed on the substrate in the same patterning process. An insulating film 33' and conductive layer 34' cover the edges of the active layer 31' and the gate insulating film 32'. A main gate electrode 35 covers an upper portion thereof. The insulating film 33' and the conductive film 34' on the edges of the active layer prevent the main gate electrode 35 from having a short circuit.

Figure 5A:
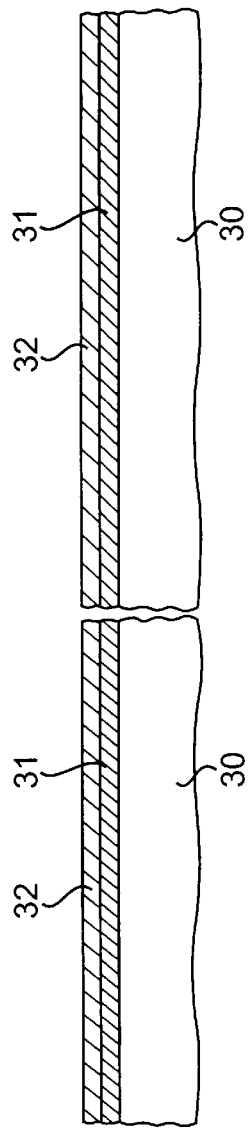

FIGS. 5A to 5E are cross-sectional views showing the process steps according to the second embodiment shown in FIG. 4. Referring to FIG. 5A, an active region layer 31 and a gate insulating layer 32 are formed on a substrate 30 by depositing a silicon layer. For example, an amorphous or polycrystal silicon layer is formed as the active region layer 31, and a silicon nitride or silicon oxide, or a silicon oxide/silicon nitride layer is deposited as the gate insulating layer 32 under vacuum condition. If the active region layer 31 is formed from amorphous silicon, it can be crystallized by laser-annealing or the SPC method.

Figure 5B:
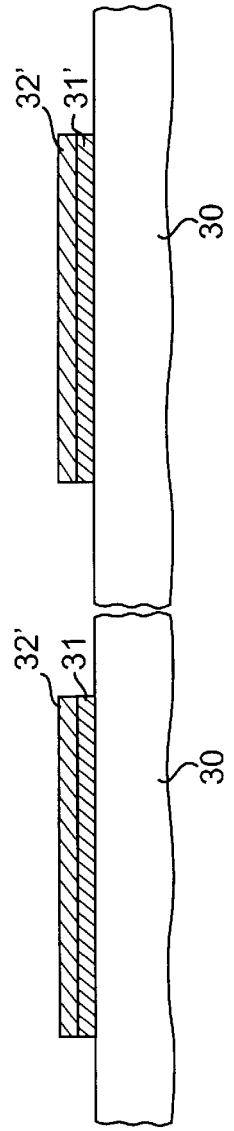

Referring to FIG. 5B, an active region 31' and an gate insulating film 32' are formed by patterning the active region layer 31 and the gate insulating layer 32 using photolithography. Alternatively, the active region layer 31 is formed from amorphous silicon and is crystallized after the patterning process in FIG. 5A.

Figure 5C:
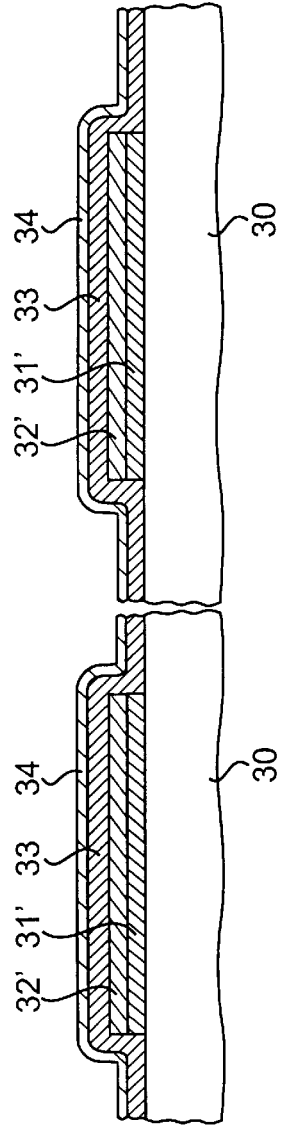

Referring to FIG. 5C, the gate insulating film 32' and the electric field control layer 33 is formed from a silicon nitride film, a silicon oxide film, a double structured insulating film such as a silicon nitride/silicon oxide, or a triple structured insulating film such as a silicon oxide/silicon nitride/silicon oxide on an exposed substrate 30 and a conductive layer 34 such as chromium or aluminum is applied. The electric control film may be formed by amorphous, polycrystalline, or microcrystalline silicon.

Referring to FIG. 5D, electric field control layers 33'a, 33'b and subsidiary gate electrodes 34'a, 34'b are formed by patterning the electric field control film forming layer 33 and conductive layer 34 using photolithography. Simultaneously, preventive layers 33' 34' are formed to cover the edge of the active layer 31' and the gate insulating film 32'.

Next as shown in FIG. 5E, after depositing a conductive layer (for example, chromium or aluminum), the main gate electrode 35 is formed by photolithography and the impurity regions 31'a, 31'b are formed in the active layer 31' by injecting a high concentration ion.

Figure 6:
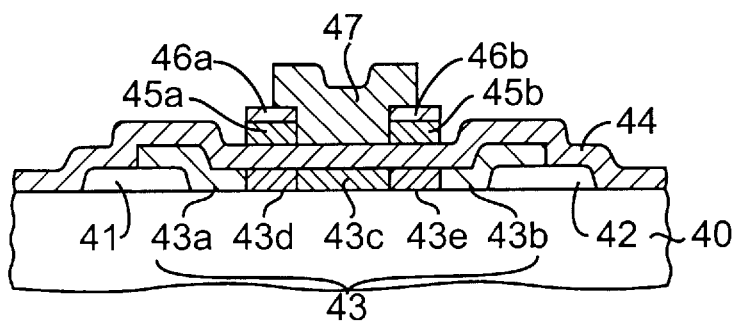
FIG. 6 is a cross-sectional view showing a structure of a third embodiment of the present invention.

FIG. 6 is a third embodiment of the present invention which uses a staggered structure of a thin film transistor. The thin film transistor includes a source electrode 41 and drain electrode 42 on a substrate 40, an active layer 43 contacts the source and drain electrodes 41, 42. A gate insulating film 44 covers an exposed substrate, the active layer 43, and the source and drain electrodes 41, 42. Electric field control layers 45a, 45b on the gate insulating film 44 overlap leakage current control regions 43d, 43e at the active layer. Subsidiary gate electrodes 46a, 46b on the electric field control layers 45a, 45b, and a main gate electrode 47 contact the subsidiary gate electrodes 46a, 46b and overlap a channel region 43c at the active layer.

FIGS. 7A to 7E show the process steps of fabricating a thin-film transistor for the third embodiment of the present invention.

Figure 7A:
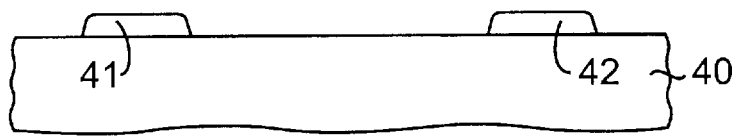
FIGS. 7A, 7B, 7C, 7D and 7E are cross-sectional views showing the process steps of fabricating a thin film transistor of the third embodiment of the present invention.

Referring to FIG. 7A, after depositing a metal layer such as aluminum or chromium on the substrate 40 by sputtering the source electrode 41 and drain electrode 42 are formed by patterning the metal layer using the process of photolithography.

Figure 7B:
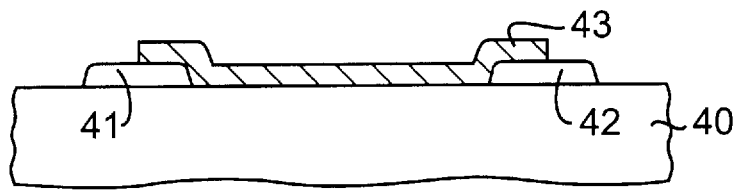

Next, referring to FIG. 7B, amorphous silicon or polycrystal silicon is deposited by a CVD method to cover an exposed surface of the substrate 40, the source electrode 41 and drain electrode 42. The active layer 43 is formed by patterning the silicon layer using photolithography and in contact with the source and drain electrodes 41, 42.

Figure 7C:
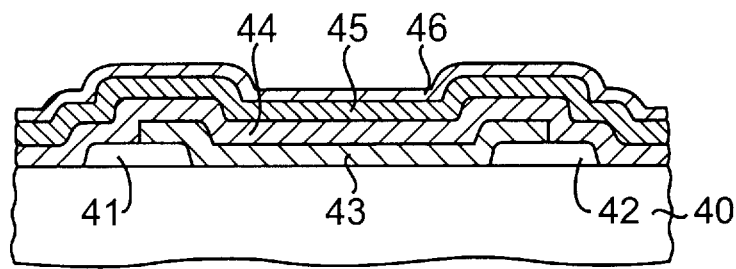

Referring to FIG. 7C, the gate insulating film 44 is formed by depositing a silicon nitride film or silicon oxide film to cover the active layer 43, the substrate 40 and the source and drain electrodes 41, 42. A layer 45 to form an electric field control layer is formed on a gate insulating film 44 by depositing a silicon nitride film or silicon oxide film, a double structure insulating film such as a silicon nitride/ silicon oxide film or a triple structure insulating film such as a silicon oxide/silicon nitride/silicon oxide film. A metal layer 46 such as chromium or aluminum to form a subsidiary gate electrode layer is deposited. In this process, an amorphous, polycrystalline or microcrystalline silicon layer can be used to form the electric field control layer 45.

Figure 7D:
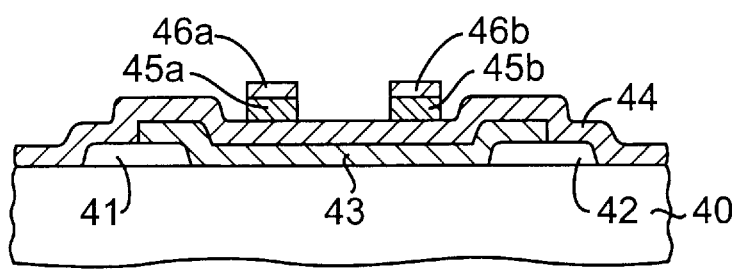

As shown in FIG. 7D, the electric field control layers 45a, 45b and subsidiary gate electrodes 46a, 46b are formed by patterning the layers 45, 46 using photolithography.

Figure 7E:
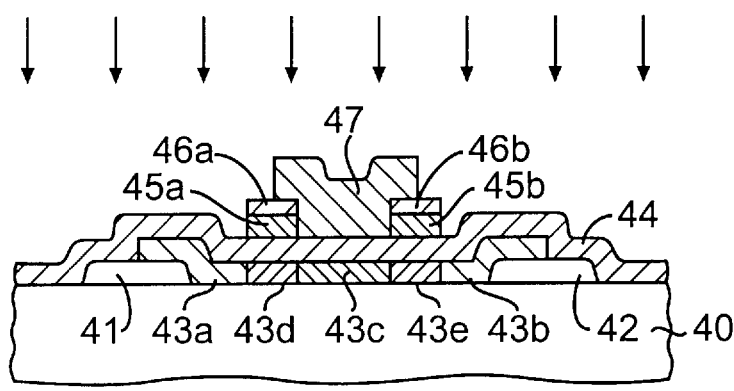

Referring to FIG. 7E, after depositing a metal layer such as chromium or aluminum on an exposed surface by sputtering the main gate electrode 47 is formed by patterning the metal layer to cover a portion of the gate insulating film 44 and the subsidiary gate electrodes 46a, 46b. The impurity regions 43a, 43b are then formed by injecting a high concentration ion on the active layer 43 using the main gate electrode 47 and subsidiary gate electrodes 46a, 46b as masks.

Figure 8A:
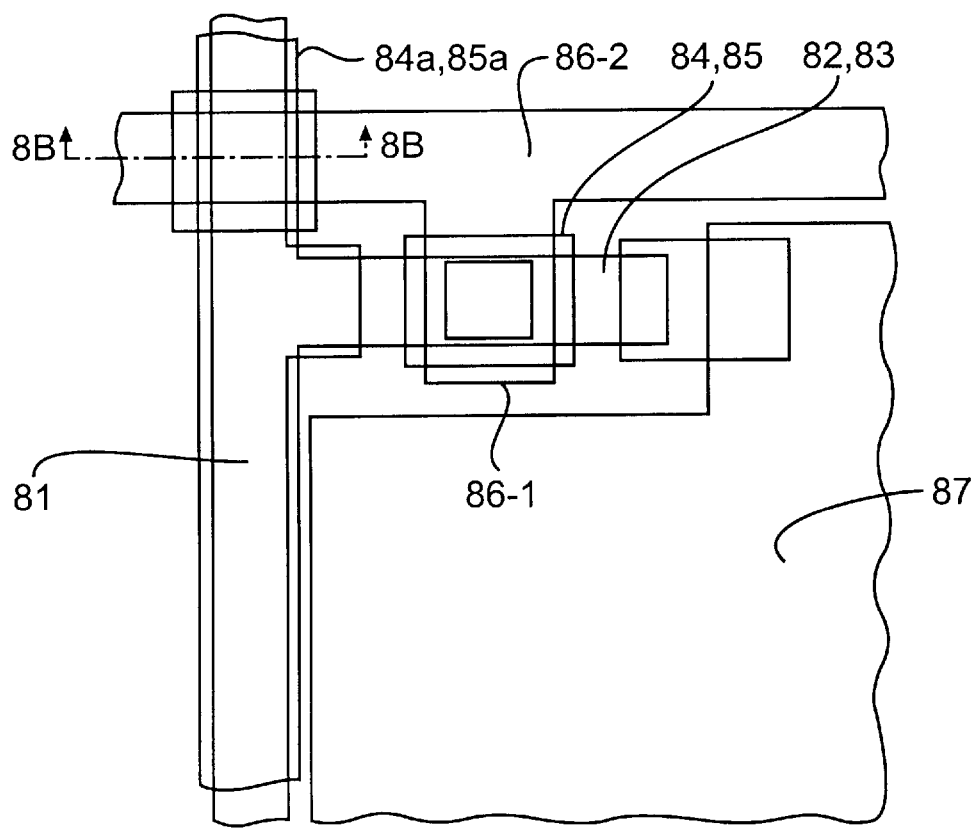
FIG. 8A is a plan view of a thin-film transistor liquid crystal display of the present invention.
Figure 8B:
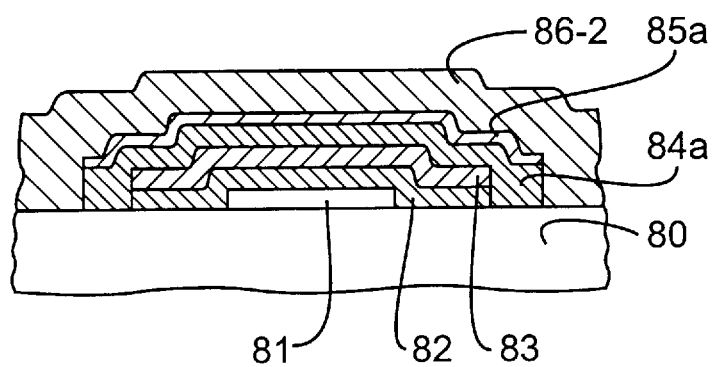
FIG. 8B is a cross-sectional view.

FIGS. 8A and 8B show a structure of the thin-film transistor array substrate applying the thin-film transistor of the present invention to a thin-film transistor liquid crystal display.

FIG. 8A is a plan view of the thin-film transistor array substrate, applying a staggered structure thin-film transistor as shown in FIG. 6. An active layer 82 and the gate insulating film 83 are formed as the same pattern as shown in the structure. At this time, an island-like parasitic capacitance reducing layer 84a and a subsidiary gate bus line 85a are formed using materials such as an insulating layer/ conductive layer forming the electric field control layer 84 and subsidiary gate electrode layer 85 at the portion where a gate bus line 86-2 and a data bus line 81 cross. Additionally, the active layer 82 and the gate insulating film 83 are formed by extending the top of the data bus line 81. Reference numerals 86-1 and 87 designate a main gate electrode, and a pixel electrode respectively.

FIG. 8B is a cross-sectional view taken along the line 8B—8B of FIG. 8A and illustrates the structure of a portion where the gate bus line 86-2 and the data bus line 81 cross.

As shown in FIG. 8B, the structure includes the data bus line 81 on a substrate 80, an active layer 82 and a gate insulating film 83 to cover the data bus line 81. A parasitic capacitance reducing layer 84a and the gate bus line subsidiary 85a cover the edge of the gate insulating film 83, the active layer 82, the gate bus line 86-2 on the gate has line subsidiary 85a, and a portion of the substrate 80.

The parasitic capacitance reducing layer 84a and the subsidiary gate bus line 85a on the portion where the gate bus line 86-1 and data bus line 81 cross are formed to reduce parasitic capacitance and to prevent the gate bus lien from having a short circuit. Since the parasitic capacitance occurs between the gate bus line 86-2 and the data bus line 89, a gate bus line signal can be delayed by an RC time constant. By leaving the insulating film to form the electric field control layer on the crossed portion, the distortion of the signal transmitted through the data bus line can be reduced. As a result, the parasitic capacitance becomes reduced. In addition, a short circuit in the gate bus line can be prevented by leaving the layer for forming the electric field control layer on the crossed portion, and the layer for forming the subsidiary gate electrode layer. The reference numerals 87 and 86-1 shown in FIG. 8A designate a pixel electrode and a main gate electrode respectively.

Figure 9A:
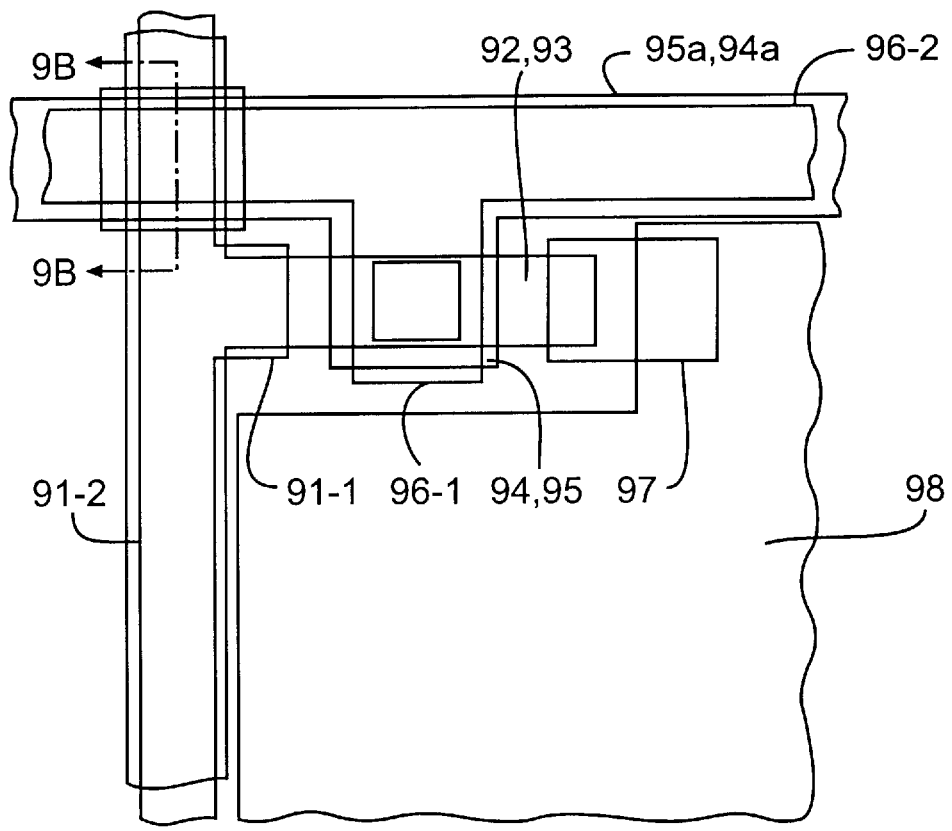
FIG. 9A is a plan view showing another structure of thin film transistor liquid crystal display of the present invention.
Figure 9B:
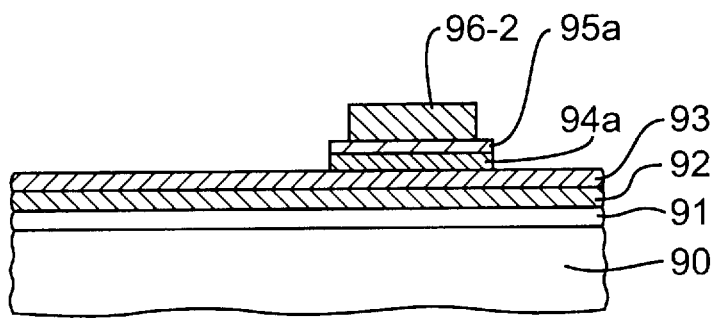
FIG. 9B is a cross-sectional view.

FIGS. 9A and 9B show the same structure as the structure shown in FIGS. 8A and 8B except the electric field control forming layer and the subsidiary gate electrode forming layer remain along a gate bus line 96-1 in addition to the crossed portion of the gate bus line 96-1 and data bus line 91. By using the above structure such as FIGS. 8A and 8B a redundancy effect of the gate bus line can be achieved. In addition, the parasitic capacitance on the crossed portion is reduced.

Referring to the plan view of FIG. 9A and a cross-sectional view of the crossed portion of FIG. 9B taken along a line 9B—9B of FIG. 9A, the structure of the thin-film transistor can be seen to be a staggered type as shown in FIG. 6. The thin film transistor includes a source electrode 91-1 and a drain electrode 97 on a substrate 90, a data bus line 91-2 extends to the source electrode 91-1. An active layer 92 covers the top of the data bus line 91-2 extended to the source and drain electrodes 91-1, 97, and a gate insulating film 93 on the source and drain electrode. Additionally, an electric field control insulating layer 94 and a subsidiary gate electrode 95 overlapped with the edge and leakage current control region at the active layer 92 between the source electrode 91-1 and drain electrode 97 are formed with the main gate electrode 96-1 and a gate bus line 96-2. The reference numeral 98 is a pixel electrode and reference numerals 94a, 95a are an electric field control insulating layer and a subsidiary gate electrode overlapped with the gate bus line 96-2 respectively.

Figure 10A:
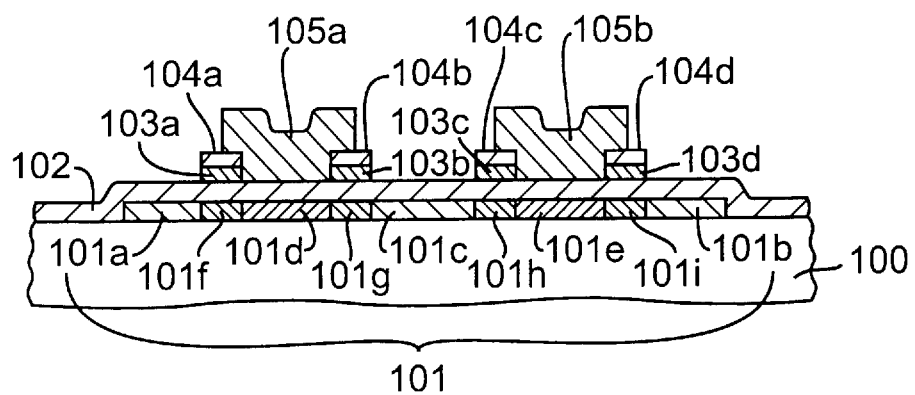
FIGS. 10A to 10B are cross-sectional views showing the structure of fourth and fifth embodiments of the present invention.
Figure 10B:
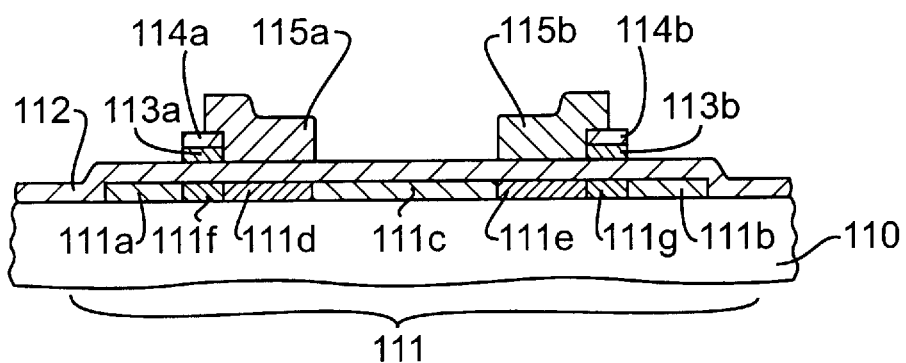

FIGS. 10A and 10B are cross-sectional views showing a thin-film transistor having two gates as a forth and fifth embodiment of the present invention, respectively.

FIG. 10A is the forth embodiment of the present invention, in which subsidiary gate electrodes 104a, 104b, 104c, 104d are formed to overlap with an active layer 101, a gate insulating film 102 and electric field control insulating layers 103a, 103b, 103c, 103d on main gate electrodes 105a, 105b. Leakage current control regions 101f, 101g, 101h, 101i are formed in pairs on respective channel regions 101 d, 101e controlled by each main gate electrode 105a, 105b. A third impurity region 101c is on the active layer 101 between the main gate electrodes 105a, 105b. The reference numerals 101a, 101 b are impurity regions connected with the source and drain electrodes.

FIG. 10B is a thin-film transistor having a double gate structure of the fifth embodiment of the present invention. This structure includes subsidiary gate electrodes 114a, 114b formed to overlap with an active layer 111, a gate insulating film 112, and electric field control layers 113a, 113b on one side of the main gates 115a, 115b. Also, leakage current control regions 111f, 111g are between the channel regions 111 d, 111 e controlled by each main gate electrodes 115a, 115b and two impurity regions 111a, 111b formed on both ends of the active layer 111. However, this structure does not include a leakage current control region between the channel regions 111d, 111e controlled by each main gate electrode 115a, 115b and the third impurity region 111c on the active layer 111 between the main gate electrodes 115a, 115b.

FIGS. 11A to 11D are cross-sectional views showing the process steps of fabricating the thin-film transistor of the present invention when a subsidiary gate electrode is formed by a high concentration impurity polycrystal silicon.

Figure 11A:
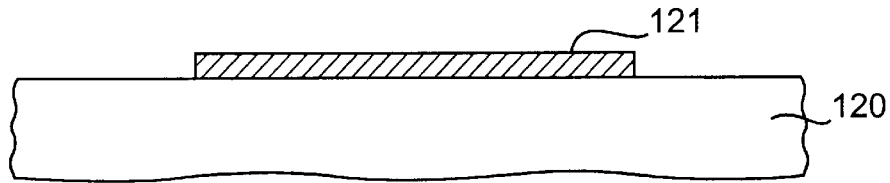
FIGS. 11A, 11B, 11C and 11D are cross-sectional views showing the process steps of fabricating a thin film transistor having subsidiary gate electrodes formed by a high concentration impurity polycrystal silicon of the present invention.

Referring to FIG. 11A, after a polycrystal silicon or amorphous silicon are deposited on a substrate 120 through CVD method, an active layer 121 is formed by patterning the polycrystal or amorphous silicon layer photolithography.

Figure 11B:
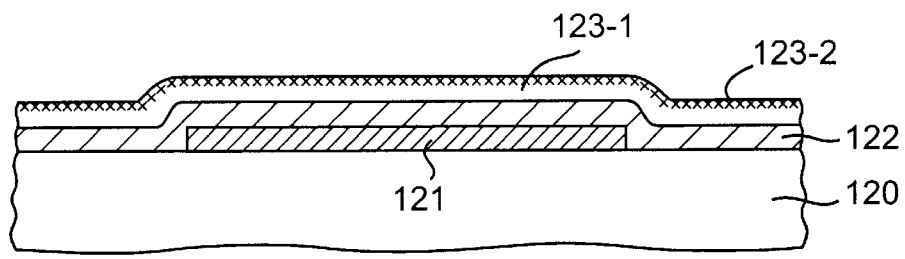

Referring to FIG. 11B, a gate insulating film 122 is formed by depositing a silicon nitride film or silicon oxide film on the active layer 121 and an exposed surface of the substrate 120. Then, a pure amorphous silicon layer is deposited using CVD on the gate insulating firm 122. A high concentration ion is injected near the surface to have a high conductivity at the upper portion of the layer so that the upper portion of amorphous silicon is defined as a subsidiary gate electrode forming layer 123-2, the lower portion is defined as an electric field control film forming layer 123-1.

Figure 11C:
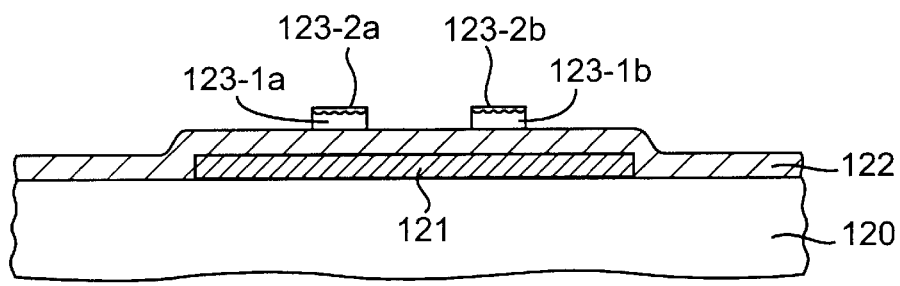

Referring to FIG. 11C, a pair of subsidiary gate electrodes 123-2a, 123-2b and electric field control layers 123-1a, 123-1b are formed by patterning the subsidiary gate electrode forming layer 123-2 formed by an impurity amorphous silicon and the electric field control film forming layer 123-1 formed by a pure amorphous silicon by photolithography.

Figure 11D:
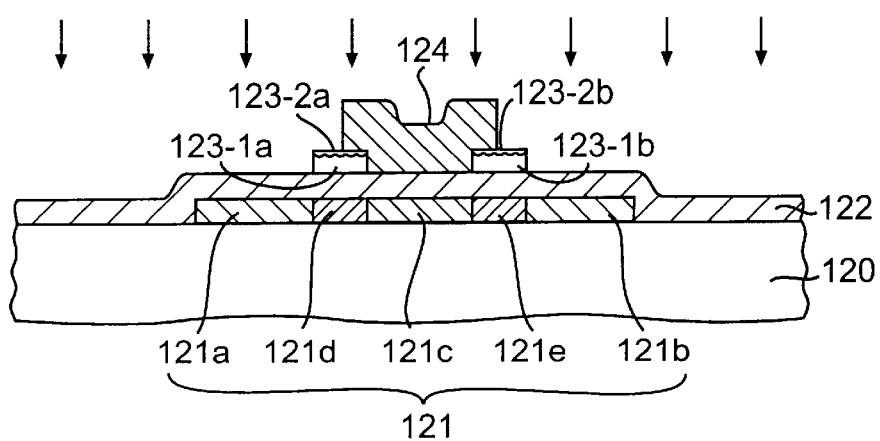

Referring to FIG. 11D, after depositing chromium or aluminum on the subsidiary gate electrodes 123-2a, 123-2b and an exposed gate insulating film 122, a main gate electrode 124 is formed on the subsidiary gate electrodes 123-2a, 123-2b and the gate insulating film 122 through photolithography. Consecutively, the impurity regions 121a, 121b are defined by injecting a high concentration ion on the active layer 121 using the main gate electrode 124 and the subsidiary gate electrodes 123-2a, 123-2b as masks. The reference numerals 121d, 121e are leakage current control regions, and 121c is a channel region.

Figure 12A:
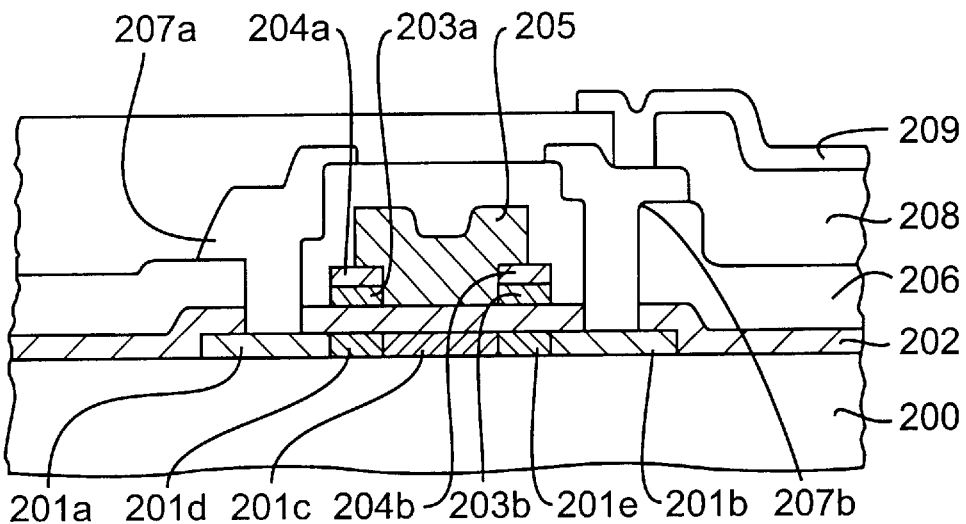
FIGS. 12A to 12B are cross-sectional views showing structures of sixth and seventh embodiments of the present invention.
Figure 12B:
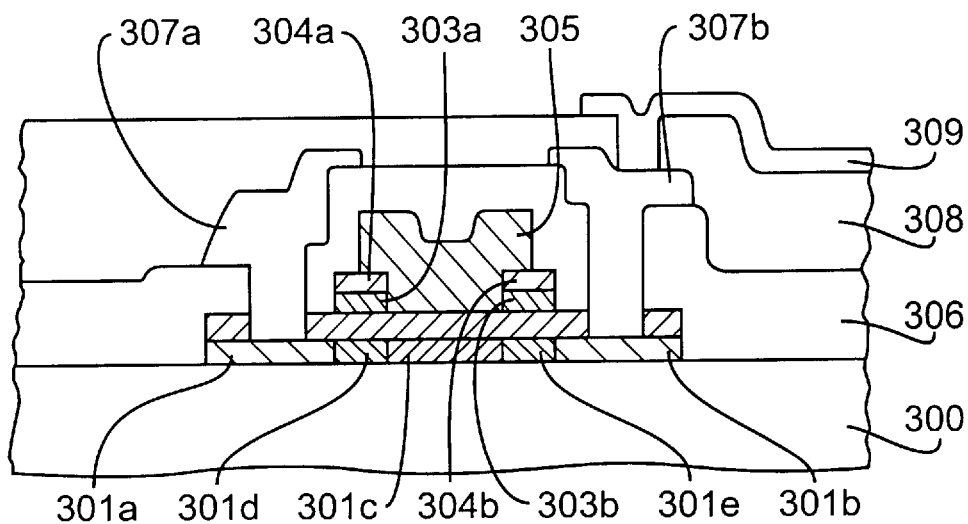

FIGS. 12A and 12B are cross-sectional views showing the liquid crystal display the sixth, and seventh embodiment of the present invention fabricated through the consequent process after thin-film transistor is completed. FIG. 12A illustrates a liquid crystal display that an active layer and a gate insulating film have a different pattern whereas, FIG. 12B illustrates a liquid crystal display that an active layer and a gate insulating film have the same pattern.

Referring to FIG. 12A, a thin-film transistor includes an active layer 201 patterned by a polycrystal silicon or amorphous silicon on the substrate 200, the gate insulating film 202 on the active layer, a pair of electric field control layers 203a, 203b patterned by a multi-layer or single-layer structure on the gate insulating film 202, a pair of subsidiary gate electrodes 204a, 204b patterned by a conductive material on the electric field control layers 203a, 203b, and the main gate electrode 205 contacting the subsidiary gate electrodes 204a, 204b and covering the active layer between the subsidiary gate electrodes 204a, 204b. The active layer 201 includes a pair of impurity regions 201a, 201b connected with a source electrode 207a and a drain electrode 207b defined at the ends of the active layer 201 by a predetermined size. Non-impurity regions between two impurity regions 201a, 201b is divided into non-impurity regions 201d, 201e below the two electric field control layers 203a, 203b, and a non-impurity region 201c overlapped with the main gate electrode 205 and the gate insulating film 202. A preventive film 208 is deposited on an exposed surface, and a pixel electrode 209 is formed on the preventive film 208 and connected to the drain electrode 207b. The reference numeral 206 is an interlayer insulating film.

Referring to FIG. 12B, a thin-film transistor includes a pair of impurity regions 301a, 301b on a substrate 300, an active layer 301 contacting a pair of leakage current control regions 301d, 301e and a channel region 301c, a gate insulating film 302 having the same pattern as an active layer 301, electric field control layers 303a, 303b overlapped with the leakage current control regions 301d, 301e and subsidiary gate electrodes 304a, 304b, and a main gate electrode 305 contacting the subsidiary gate electrodes 304a, 304b and overlapped with the channel region 301c. The impurity regions 301a, 301b are connected to the source electrode 307a and the drain electrode 307 respectively. A preventive film 308 covers an expose surface and a pixel electrode 309 is formed on the preventive film 308 connected to the drain electrode 307b. The reference numeral 306 is an interlayer insulating film.

Figure 1:
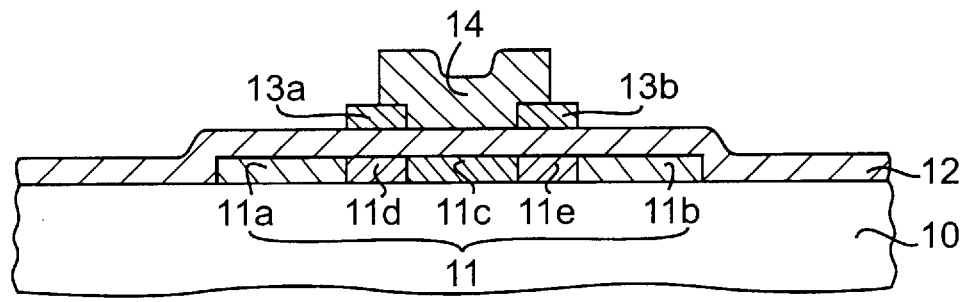
FIG. 1 is a cross-sectional view of a conventional thin film transistor.

As the above explained thin-film transistor and the liquid crystal display using the same thin-film transistor and the method of fabricating the same can solve the problem of on-current reduction occurred in the thin-film transistor shown in FIG. 1. By forming the subsidiary gate electrodes on the electric field control layer, the leakage current control regions controlling the leakage current on one side or both sides of the channel region, the leakage current at off-state can be reduced without reducing current in on-state. Further, since the leakage current control region controlled by the subsidiary gate electrodes is defined by photolithography, the uniform device can be fabricated through this method.

As the first embodiment of the present invention, since the subsidiary gate electrodes and the electric field control layer are formed at the edge of the active layer, the short circuit at the active layer due to difference between the edges and the main gate electrode can be eliminated.

Additionally, in applying the thin-film transistor of the present invention to the liquid crystal display, since the subsidiary gate electrode and the electric field control layer are extended to form on the lower portion of the gate bus line, the redundancy effect at the gate bus line is achieved. Alternatively, instead of forming the subsidiary gate electrode and the electric field control layer extended to the lower portion of the whole gate bus line, an island-like pattern is formed on the portion where the data bus line and gate bus line are crossed, a parasitic capacitance on the crossed portion is reduced.

It will be apparent to those skilled in the art that various modifications and variations can be made in a thin-film transistor liquid crystal display and a method of manufacturing the same of the present invention without departing from the spirit or scope of the invention. Thus, it is intended that the present invention cover the modifications and variations of this invention provided they come within the scope of the appended claims and their equivalents.

What is claimed is:

1. A thin-film transistor liquid crystal display comprising:

a substrate;

an active layer on the substrate having first and second impurity regions and first, second, and third non-impurity regions;

a gate insulating layer on the active layer;

first and second electric field control layers on the second and third non-impurity regions, respectively;

first and second subsidiary gate electrodes on the first and second electric field control layers, respectively; and a main gate electrode on the gate insulating layer, the main gate electrode contacting the first and second subsidiary gate electrodes and the first and second electric field control layers.

2. The thin-film transistor liquid crystal display according to claim 1, wherein the gate insulating layer covers the active layer and an exposed surface of the substrate.

3. The thin-film transistor liquid crystal display according to claims 1, wherein the gate insulating layer and the active layer have the same pattern.

4. The thin-film transistor liquid crystal display according to claim 3, wherein the subsidiary gate electrodes and the electric field control layers cover edges of the active layer and the gate insulating layer.

5. The thin-film transistor liquid crystal display according to claim 1, further comprising source and drain electrodes being below and contacting the first and second impurity regions, respectively.

6. The thin-film transistor liquid crystal display according to claim 1, wherein the electric field control layers include at least one of an amorphous silicon layer, polycrystalline silicon layer, and microcrystalline silicon layer.

7. The thin-film transistor liquid crystal display according to claim 1, wherein the non-impurity regions are leakage current control regions.

8. The thin-film transistor liquid crystal display according to claim 1, wherein the first non-impurity region is a channel region.

9. The thin-film transistor liquid crystal display according to claim 1, wherein the gate insulating layer includes at least one of silicon oxide film, silicon nitride film, silicon oxide/silicon nitride, silicon nitride/silicon oxide film, and silicon oxide/silicon nitride/silicon oxide film.

10. The thin-film transistor liquid crystal display according to claim 1, further comprising:
    third, fourth, fifth, and sixth non-impurity regions, and a second channel region on the substrate;
    third and fourth electric field control layers on the fifth and sixth non-impurity regions, respectively;
    third and fourth subsidiary gate electrodes on the third and fourth electric field control layers, respectively; and
    a second main gate electrode on the gate insulating layer, the second main gate electrode contacting the third and fourth subsidiary gate electrodes and the third and fourth electric field control layers, respectively.

11. A thin-film transistor liquid crystal display comprising:
    a substrate;
    an active layer having first and second impurity regions;
    first and second leakage current control regions and a channel region,
    a gate insulating layer on the active layer, and an exposed surface of the substrate;
    first and second electric field control layers on the first and second leakage current control regions, respectively;
    first and second subsidiary gate electrodes on the first and second electric field control layers, respectively;
    a main gate electrode on the gate insulating layer, the main gate electrode contacting the first and second subsidiary gate electrodes and the first and second electric field control layers, respectively.

12. The thin-film transistor liquid crystal display according to claim 11, further comprising:
    source and drain electrodes below and contacting the first and second impurity regions, respectively;
    a first insulating layer on an exposed surface of the substrate except the source and drain electrode;
    a second insulating layer on the first insulating layer on the first insulating layer and the source drain electrodes, the second insulating layer having a contact hole over the drain electrode; and
    a pixel electrode contacting the drain electrode through the contact hole.

13. The thin-film transistor liquid crystal display according to claim 11, wherein the electric field control layers include at least one of an amorphous silicon layer, polycrystalline silicon layer, and microcrystalline silicon layer.

14. The thin-film transistor liquid crystal display according to claim 11, wherein the gate insulating layer includes at least one of silicon oxide film, silicon nitride film, silicon oxide/silicon nitride film, silicon nitride/silicon oxide film, and silicon oxide/silicon nitride/silicon oxide film.

15. A thin-film transistor liquid crystal display comprising:
    a substrate;
    an active layer having first and second impurity regions;
    first and second leakage current control regions and a channel region,
    a gate insulating layer on the active layer, the gate insulating has a pattern the same as the active layer;
    first and second electric field control layers on the first and second leakage current control regions, respectively;
    first and second subsidiary gate electrodes on the first and second electric field control layers, respectively;
    a main gate electrode on the gate insulating layer, the main gate electrode contacting the first and second subsidiary gate electrodes and the first and second electric field control layers, respectively.

16. The thin-film transistor liquid crystal display according to claim 15, wherein the subsidiary gate electrodes and the electric field control layers cover edges of the active layer and the gate insulating layer.

17. The thin-film transistor liquid crystal display according to claim 15, wherein the electric field control layers include at least one of an amorphous silicon layer, polycrystalline silicon layer, and microcrystalline silicon layer.

18. The thin-film transistor liquid crystal display according to claim 15, wherein the gate insulating layer includes at least one of silicon oxide, silicon nitride, silicon oxide/silicon nitride, silicon nitride/silicon oxide, and silicon oxide/silicon nitride/silicon oxide.

19. A thin film transistor liquid crystal display comprising:
    a substrate;
    an active layer having first and second impurity regions;
    first and second leakage current control regions and a channel region,
    a gate insulating layer on the active layer and an exposing surface over the substrate;
    first and second electric field control layers on the first and second leakage current control regions, respectively;
    first and second subsidiary gate electrodes on the first and second electric field control layers, respectively; and
    source and drain electrodes contacting the first and second impurity regions, respectively, a portion of the source and drain electrodes being below the first and second impurity regions.

20. The thin-film transistor liquid crystal display according to claim 19, further comprising:
    source and drain electrodes contacting the first and second impurity regions, respectively;
    a data bus line extended to the source electrode;
    a gate bus line extended to the main gate electrode, the gate bus line and the data bus line being crossed each other;
    a subsidiary gate bus line on the electric field control layers, the subsidiary gate electrode, and a pixel electrode.

21. The thin-film transistor liquid crystal display according to claim 19, further comprising a parasitic capacitance reducing layer on the gate insulating layer including a portion of the substrate.

22. The thin-film transistor liquid crystal display according to claim 19, wherein the electric field control layers include at least one of an amorphous silicon layer, polycrystalline silicon layer, and microcrystalline silicon layer.

23. The thin-film transistor liquid crystal display according to claim 19, wherein the gate insulating layer includes at least one of silicon oxide, silicon nitride, silicon oxide/silicon nitride, silicon nitride/silicon oxide, and silicon oxide/silicon nitride/silicon oxide.

24. A thin film transistor liquid crystal display comprising:
   a substrate;
   an active layer having first, second, and third impurity regions, first and second leakage current control regions and first and second channel regions on the substrate, the leakage current control regions being between one of the impurity regions and one of the channel regions;
   a gate insulating layer on the active layer including an exposed surface of the substrate;
   first and second electric field control layers on the first and second leakage current control regions, respectively;
   first and second subsidiary gate electrodes on the first and second electric field control layers, respectively;
   first and second main gate electrodes on the gate insulating layer, the first main gate electrode contacting the first electric field control layer and the first subsidiary main gate electrode, the second main gate electrode contacting the second electric field control layer and the second subsidiary main gate electrode, respectively; and
   source and drain electrodes contacting the impurity regions.

25. The thin-film transistor liquid crystal display according to claim 24, wherein the electric field control layers include at least one of an amorphous silicon layer, polycrystalline silicon layer, and microcrystalline silicon layer.

26. The thin-film transistor liquid crystal display according to claim 24, wherein the gate insulating layer includes at least one of silicon oxide, silicon nitride, silicon oxide/silicon nitride, silicon nitride/silicon oxide, and silicon oxide/silicon nitride/silicon oxide.

27. A method of fabricating a thin film transistor liquid crystal display, the method comprising the steps of:
   forming an active layer on a substrate;
   forming a gate insulating layer on the active layer including an exposed surface of the substrate;
   forming first and second electric field control layers on the gate insulating layer;
   forming first and second subsidiary gate electrodes on the first and second electric field control layers, respectively;
   forming a main gate electrode on the gate insulating layer including portions of the electric filed control layers and the subsidiary gate electrodes; and
   implanting impurity ions using the main gate electrode and the subsidiary gate electrodes as masks to form first and second impurity regions and first, second, and third non-impurity regions at the active layer.

28. The method according to claim 27, the active layer in the step of forming the active layer includes an intrinsic silicon layer.

29. The method according to claim 27, the electric field control layers includes at least one of an amorphous silicon layer, polycrystalline silicon layer, and microcrystalline silicon layer.

30. The thin-film transistor liquid crystal display according to claim 27, wherein the gate insulating layer includes at least one of silicon oxide, silicon nitride, silicon oxide/silicon nitride, silicon nitride/silicon oxide, and silicon oxide/silicon nitride/silicon oxide.

31. The thin-film transistor liquid crystal display according to claim 27, the first non-impurity region is a channel region.

32. A method of fabricating a thin film transistor liquid crystal display, the method comprising the steps of:
   forming an active layer on a substrate
   forming a gate insulating layer on the active layer;
   patterning the active layer and the gate insulating layer simultaneously;
   forming first and second electric field control layers on the gate insulating layer, the first and second electric field control layers covering edges of the active layer and the gate insulating layer;
   forming first and second subsidiary gate electrodes on the first and second electric control layers, respectively;
   forming a main gate electrode on the gate insulating layer including portions of the electric field control layers and the subsidiary gate electrodes; and
   implanting impurity ions using the main gate electrode and the subsidiary gate electrodes as masks to form first and second impurity regions and first, second, and third non-impurity regions at the active layer.

33. The method according to claim 32, the active layer in the step of forming the active layer includes an intrinsic silicon layer.

34. The method according to claim 32, the electric field control layers includes at least one of an amorphous silicon layer, polycrystalline silicon layer, and microcrystalline silicon layers.

35. The thin-film transistor liquid crystal display according to claim 32, wherein the gate insulating layer includes at least one of silicon oxide, silicon nitride, silicon oxide/silicon nitride, silicon nitride/silicon oxide, and silicon oxide/silicon nitride/silicon oxide.

36. The method according to claim 32, the first non-impurity region is a channel region.

37. A method of fabricating a thin film transistor liquid crystal display, the method comprising the steps of:
   forming source and drain electrodes on a substrate;
   forming an active layer on the substrate including a portions of the source and drain electrodes;
   forming a gate insulating layer on an exposed surface of the substrate;
   forming first and second electric field control layers;
   forming first and second subsidiary gate electrodes on the first and second electric field control layers, respectively;
   forming a main gate electrode on the gate insulating layer including portions of the subsidiary gate electrodes and the electric field control layers; and
   implanting impurity ions using the main gate electrodes and the subsidiary gate electrode as masks to form a first and second impurity regions and first, second, and third non-impurity regions at the active layer.

38. The method according to claim 37, the active layer in the step of forming the active layer includes an intrinsic silicon layer.

39. The method according to claim 37, the electric field control layers includes at least one of an amorphous silicon layer, polycrystalline silicon layer, and microcrystalline silicon layer.

40. The thin-film transistor liquid crystal display according to claim 37, wherein the gate insulating layer includes at least one of silicon oxide, silicon nitride, silicon oxide/ silicon nitride, silicon nitride/silicon oxide, and silicon oxide/silicon nitride/silicon oxide.

41. The thin-film transistor liquid crystal display according to claim 37, the first non-impurity region is a channel region.

42. The method according to claim 37, further comprising the steps of:
   forming a data bus line on the substrate, the data bus line contacting the source electrode;
   forming a parasitic capacitance reducing layer on the gate insulating layer including the portion of the substrate;
   forming a subsidiary data bus line on the parasitic capacitance reducing layer; and
   forming a gate bus line contacting the main gate electrode, the gate bus line being on the subsidiary data bus line including the portion of the substrate.

43. A method of fabricating a thin film transistor liquid crystal display, the method comprising the steps of:
   forming an active layer on a substrate;
   forming a gate insulating layer on the active layer including an exposed surface of the substrate;
   forming an amorphous silicon layer on the gate insulating layer;
   implanting impurity ions against the amorphous silicon layer to have an impurity concentration at the surface of the silicon layer higher than that of the rest of the silicon layer;
   patterning the amorphous silicon layer to form first and second electric field control layer and first and second subsidiary gate electrodes;
   forming a main gate electrode on the gate insulating layer including portions of the subsidiary gate electrodes and the electric field control layers; and
   implanting impurity ions using the main gate electrodes and subsidiary gate electrodes as masks to form first and second impurity regions and first, second, and third non-impurity regions at the active layer.

44. The method according to claim 43, wherein the active layer in the step of forming the active layer includes an intrinsic silicon layer.

45. The thin-film transistor liquid crystal display according to claim 43, wherein the gate insulating layer includes at least one of silicon oxide, silicon nitride, silicon oxide/ silicon nitride, silicon nitride/silicon oxide, and silicon oxide/silicon nitride/silicon oxide.

* * * * *